(12) United States Patent
Saito et al.

(10) Patent No.: US 8,114,759 B2
(45) Date of Patent: Feb. 14, 2012

(54) DICING METHOD USING A DIE ATTACH FILM ON AN ADHESIVE SHEET

(75) Inventors: Takeshi Saito, Shibukawa (JP); Tomomichi Takatsu, Shibukawa (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/992,616

(22) PCT Filed: Mar. 3, 2009

(86) PCT No.: PCT/JP2009/053920
§ 371 (c)(1),
(2), (4) Date: Nov. 15, 2010

(87) PCT Pub. No.: WO2009/144985
PCT Pub. Date: Dec. 3, 2009

(65) Prior Publication Data
US 2011/0065261 A1    Mar. 17, 2011

(30) Foreign Application Priority Data

May 29, 2008    (JP) ................................. 2008-141023

(51) Int. Cl.
*H01L 21/00* (2006.01)
(52) U.S. Cl. .. 438/465; 438/464; 438/460; 257/E21.599
(58) Field of Classification Search .................. 438/460, 438/464, 465; 257/E21.599
See application file for complete search history.

(56) References Cited

U.S. PATENT DOCUMENTS

| | | | |
|---|---|---|---|
| 2006/0050081 A1* | 3/2006 | Kobayashi et al. | 345/597 |
| 2006/0188725 A1* | 8/2006 | Yoshida et al. | 428/411.1 |
| 2006/0204749 A1 | 9/2006 | Kita et al. | |
| 2006/0252234 A1* | 11/2006 | Saiki | 438/464 |
| 2007/0138605 A1* | 6/2007 | Nam et al. | 257/666 |

(Continued)

FOREIGN PATENT DOCUMENTS

JP    8-73822    3/1996

(Continued)

OTHER PUBLICATIONS

International Search Report issued in PCT/JP2009/053920 on May 26, 2009.

*Primary Examiner* — Kevin Parendo
(74) *Attorney, Agent, or Firm* — Stein McEwen, LLP

(57) ABSTRACT

With the invented dicing method, by increasing the cohesive strength while decreasing the adhesive strength of an ultraviolet-curing adhesive in advance, mixing of the ultraviolet-curing adhesive layer of an adhesive sheet with a die attach film on a dicing line can be decreased and pickup failures can be reduced, when picking up chips having a die attach film after dicing. The dicing method for a semiconductor wafer with a die-attach film comprises a first gluing step in which a die attach film is affixed to an adhesive sheet having an ultraviolet-curing adhesive laminated on a base material film, a second gluing step in which a semiconductor wafer is affixed to the opposite side of the die attach film affixed to the adhesive sheet, an ultraviolet irradiation step in which the ultraviolet-curing adhesive is irradiated with ultraviolet light, and a dicing step in which the semiconductor wafer and the die attach film affixed to the adhesive sheet are diced.

2 Claims, 4 Drawing Sheets

U.S. PATENT DOCUMENTS

| | | |
|---|---|---|
| 2007/0264498 A1 | 11/2007 | Shintani et al. |
| 2007/0276079 A1 | 11/2007 | Saiki et al. |

FOREIGN PATENT DOCUMENTS

| | | |
|---|---|---|
| JP | 2006-49509 | 2/2006 |
| JP | 2006-137816 | 6/2006 |
| JP | 2006-225566 | 8/2006 |
| JP | 2007-246633 | 9/2007 |
| JP | 2007-302797 | 11/2007 |
| JP | 2007-314603 | 12/2007 |
| JP | 2008-21897 | 1/2008 |

* cited by examiner

(UV IRRADIATION STEP)

(DICING STEP)

DICING METHOD USING A DIE ATTACH FILM ON AN ADHESIVE SHEET

CROSS-REFERENCE TO RELATED APPLICATIONS

This application claims the benefit of PCT International Patent Application No. PCT/JP2009/053920, filed Mar. 3, 2009, and Japanese Patent Application No. 2008-141023, filed May 29, 2008, in the Japanese Patent Office, the disclosures of which are incorporated herein by reference.

BACKGROUND OF THE INVENTION

1. Field of the Invention

The present invention relates to a dicing method for dicing a semiconductor wafer with a die attach film into chip form.

2. Description of the Related Art

One method of manufacturing electronic components comprises a laminating step of laminating an electronic component assembly consisting of a plurality of circuit patterns formed on an insulating substrate or a wafer to an adhesive sheet, a cutting/separating step (dicing step) of cutting the laminated wafer or electronic component assembly to form chips, a UV irradiation step of irradiating with UV rays from the adhesive sheet side to reduce the adhesive force of the adhesive layer, a pick up step of picking up the separately cut chips from the adhesive sheet, and a fixing step of applying an adhesive to the bottom surfaces of the picked up chips and fixing them to a lead frame or the like by means of this adhesive.

Regarding the cutting step, a method of laminating a wafer or electronic component assembly to an adhesive sheet and further fixing the adhesive sheet to a ring frame, then cutting and separating (dicing) into separate chips is known.

Methods of using an adhesive sheet (die attach film-integrated sheet) having a die attach film laminated onto an adhesive sheet used in such a manufacturing method and thus having both the function of an adhesive sheet for use in dicing and the function of an adhesive for fixing chips to a lead frame or the like have been proposed (see Patent Document 1 and Patent Document 2). The step of applying adhesive after dicing can be skipped by using a die attach film-integrated sheet for manufacturing electronic components.

Additionally, die attach film-integrated sheets excel in their ability to control the thickness of the adhesive portion and suppress excess adhesive being squeezed out as compared with methods using adhesives to bond the chips and lead frame.

However, with increased integration of semiconductor components, chip sizes have become larger and thinner, increasing cases in which the chip pick up work after dicing is difficult. Furthermore, at the time of dicing, not only the semiconductor wafer, but also the die attach film and the adhesive layer on the adhesive sheet, are diced, so that the die attach films and adhesive layers can be intermixed on the dicing line, and even after irradiation by UV rays subsequent to dicing for the purpose of reducing the adhesive force, there are cases of poor separability during pick up resulting in pick up errors.

Patent Document 1: JP 2006-049509 A
Patent Document 2: JP 2007-246633 A

SUMMARY OF THE INVENTION

The present invention was made in consideration of the above-mentioned circumstances, and has the purpose of offering a semiconductor wafer dicing method wherein the adhesive sheet and the die attach film can be easily separated at the time of pick up, thereby making the chip pick up work after dicing easier.

The present invention offers a dicing method for a semiconductor wafer having a die attach film, comprising a first laminating step of laminating a die attach film to an adhesive sheet formed by laminating a UV-curable adhesive onto a substrate film; a second laminating step of laminating a semiconductor wafer onto the opposite side of the die attach film laminated to the adhesive sheet; a UV irradiation step of irradiating the UV-curable adhesive with UV rays; and a dicing step of dicing the semiconductor wafer and die attach film laminated to the adhesive sheet.

According to the dicing method of the present invention, a UV irradiation step of irradiating the UV-curable adhesive with UV rays is provided between the second laminating step and the dicing step, so as to lower the adhesive force of the UV-curable adhesive beforehand, while increasing the cohesive force. As a result, it is possible to reduce intermixture of the die attach film and the UV-curable adhesive layer of the adhesive sheet on the dicing line when picking up the chips with die attach films after dicing.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Herebelow, a dicing method according to an embodiment of the present invention shall be explained.

In the present specification, the term "monomer" shall be used to refer both to so-called "monomers" themselves, and to monomer-based structures. Where not specifically indicated otherwise, the parts and percentages in the present specification are all based on a standard by mass. In the present specification, the expression "(meth) group" refers collectively to acryloyl groups and methacryloyl groups. The names of compounds including the expression "(meth)" such as "(meth)acrylic acid" likewise refer collectively to compounds having "meth" and compounds not having "meth" in their names. The function number of urethane acrylate oligomers refers to the number of vinyl groups per molecule of urethane acrylate oligomer.

Figure 1:
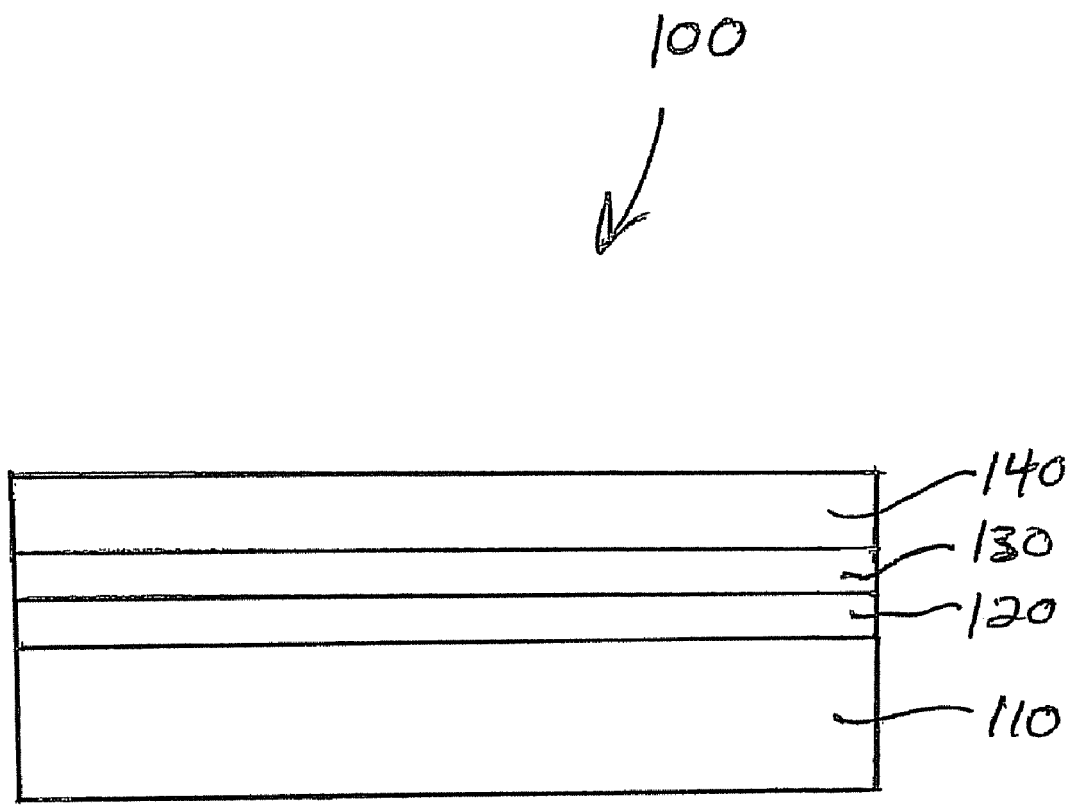
FIG. 1 depicts a semiconductor wafer with a die attach film, according to one embodiment of the invention.
Figure 2A:
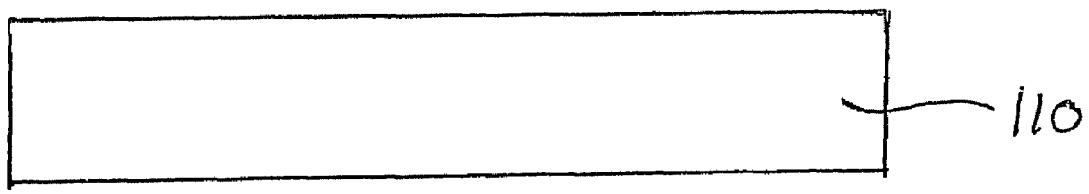
FIG. 2A depicts a substrate film, according to one embodiment of the invention.
Figure 2B:
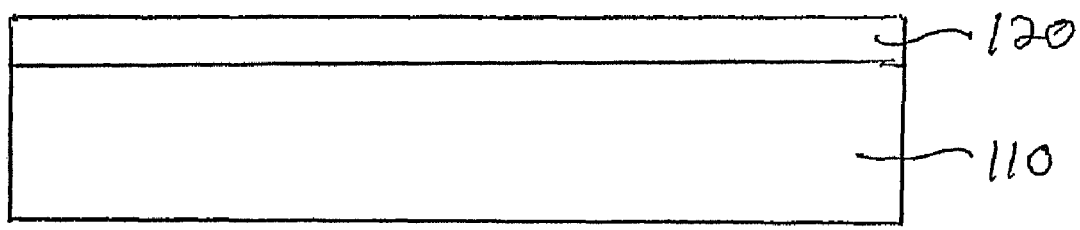
FIG. 2B depicts lamination of a UV-curable adhesive onto the substrate film, according to one embodiment of the invention.
Figure 2C:
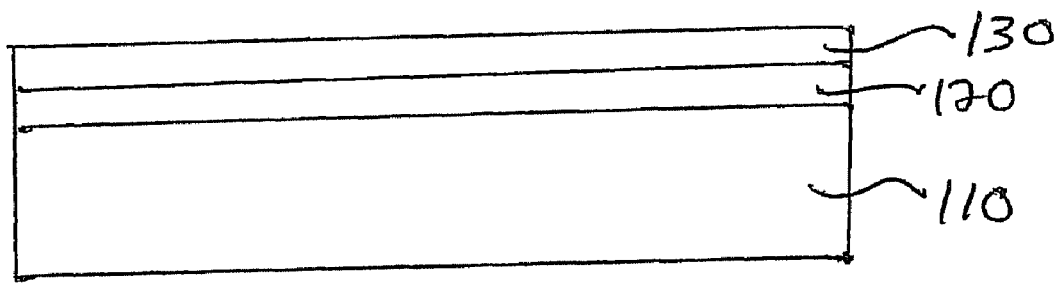
FIG. 2C depicts lamination of a die attach film to an adhesive sheet formed by lamination of the UV-curable adhesive onto the substrate film, according to one embodiment of the invention.
Figure 2D:
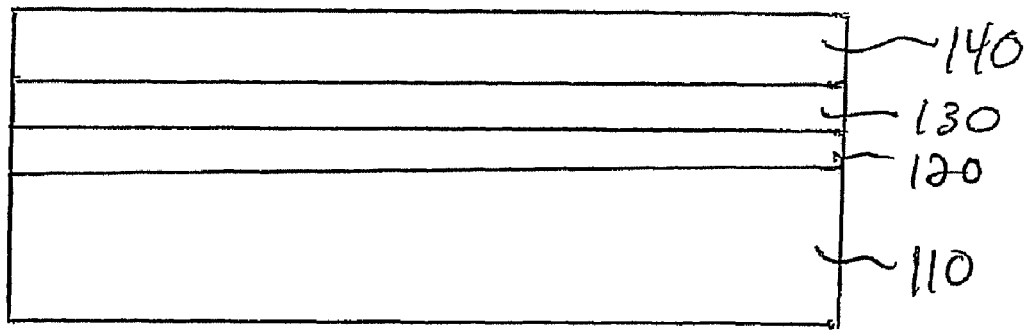
FIG. 2D depicts lamination of a semiconductor wafer onto the die attach film laminated to the adhesive sheet, according to one embodiment of the invention.
Figure 2E:
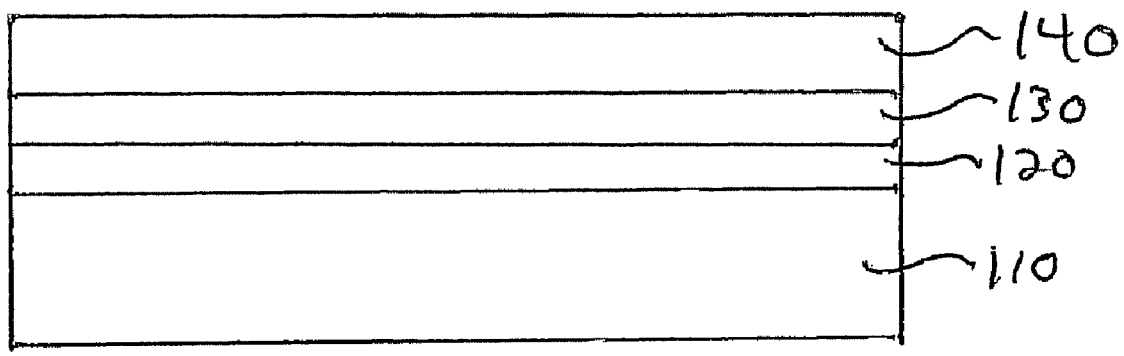
FIG. 2E depicts a UV irradiation step of irradiating the UV-curable adhesive with UV rays, according to one embodiment of the invention.
Figure 2F:
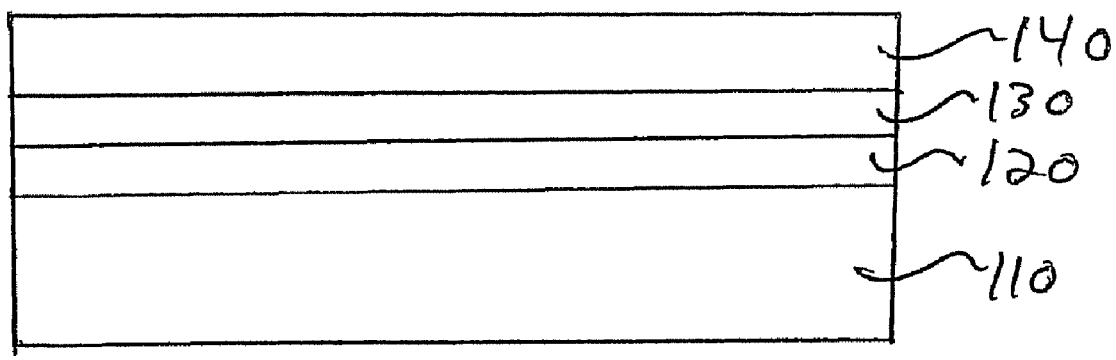
FIG. 2F depicts a dicing step of dicing the semiconductor wafer and die attach film laminated to the adhesive sheet, according to one embodiment of the invention.

Referring to FIG. 1, one exemplary embodiment is shown of a structure 100 comprising a UV-curable adhesive 120 laminated onto a substrate film 110, and a die attach film 130 laminated to the adhesive sheet formed by the UV-curable adhesive 120 laminated onto the substrate film 110. FIG. 1 also depicts semiconductor wafer 140 laminated onto the die attach film 130 laminated to the adhesive sheet.

Referring to FIGS. 2A-2F, a dicing method according to one embodiment of the present invention is shown. According to this embodiment, a dicing method for semiconductor wafers having die attach films includes a first laminating step of laminating a die attach film 130 to an adhesive sheet formed by laminating a UV-curable adhesive 120 onto a substrate film 110; a second laminating step of laminating a semiconductor wafer 140 onto the opposite side of the die attach film 130 laminated to the adhesive sheet; a UV irradiation step of irradiating the UV-curable adhesive 120 with UV rays; and a dicing step of dicing the semiconductor wafer 140 and die attach film 130 laminated to the adhesive sheet.

Herebelow, the steps in the above dicing method shall be explained.

<First Laminating Step>

The dicing method according to the present embodiment comprises a first laminating step of laminating a die attach film 130 to an adhesive sheet formed by laminating a UV-curable adhesive 120 onto a substrate film 110.

(Adhesive Sheet)

The adhesive sheet is produced by applying a UV-curable adhesive 120 to a substrate film 110, and consists of a substrate film 110 and a UV-curable adhesive layer 120 laminated onto the substrate film 110.

(Substrate Film)

The thickness of the substrate film 110 is preferably at least 30 μm, and more preferably at least 60 μm to prevent tearing of the adhesive sheet when the adhesive sheet is stretched in the pick up step. Additionally, the thickness of the substrate film 110 is preferably at most 300 μm, and more preferably at most 200 μm to achieve high elasticity when the adhesive sheet is stretched during pick up.

The material of the substrate film 110 is not particularly restricted, and may, for example, be polyvinyl chloride, polyethylene terephthalate, an ethylene-vinyl acetate copolymer, an ethylene-acrylic acid-acrylic acid ester film, an ethylene-ethyl acrylate copolymer, a thermoplastic olefinic elastomer, a polyethylene, a polypropylene, a polypropylene copolymer, an ethylene-acrylic acid copolymer, or an ionomer resin obtained by crosslinking an ethylene-(meth)acrylic acid copolymer or an ethylene-(meth)acrylic acid-(meth)acrylic acid ester copolymer with metal ions. As substrate films, it is possible to use mixtures of these resins, copolymers and multilayer films.

The material of the substrate film 110 is preferably an ionomer resin. Among ionomer resins, those obtained by crosslinking copolymers having ethylene units, (meth)acrylic acid units and (meth)acrylic acid alkyl ester units with metal ions such as $Na^+$, $K^+$ and $Zn^{2+}$ are suitable for being capable of suppressing the generation of whisker-shaped shavings.

The substrate film 110 preferably has a melt flow rate (MFR) of 0.5-6.0 g/10 min (JIS K7210, 210° C.).

Additionally, the substrate film 110 is preferably a film including $Zn^{2+}$ ions having a melting point of 80-98° C.

The method of molding the substrate film 110 is not particularly restricted, and examples include calender molding, T-die extrusion, inflation and casting.

Among these, T-die extrusion is especially preferred for achieving better precision in the substrate film thickness.

The method of forming a UV-curable adhesive layer 120 on the substrate film 110 to form an adhesive sheet is not particularly restricted, and examples include methods of direct application of adhesive onto the substrate film 110 by means of a coater such as a gravure coater, a comma coater, a bar coater, a knife coater or a roll coater. Alternatively, the adhesive can be printed onto the substrate film 110 by relief printing, intaglio printing, planographic printing, flexographic printing, offset printing or screen printing.

Among these, the comma coater is preferable for achieving better productivity and precision of thickness.

(UV-Curable Adhesive)

The UV-curable adhesive 120 provided on the substrate film 110 may be of a type that is conventionally known. The components of the UV-curable adhesive 120 and its functions when irradiated with UV rays are such that the adhesive strength is achieved by the base polymer which is the main ingredient, and cured by a UV polymerization initiator that forms UV-polymerizable compounds having unsaturated bonds into a three-dimensional mesh structure when subjected to UV radiation.

In order to improve the pick up ability, the above-mentioned base polymer should preferably be a (meth)acrylic acid ester polymer and the above-mentioned UV-polymerizable compound should preferably be a urethane acrylate oligomer having at least four vinyl groups, and furthermore, a UV polymerization initiator and a silicone graft polymer should be included.

As the above-mentioned base polymer, it is possible to use commonly known (meth)acrylic acid ester polymers, rubber-based adhesives and the like.

A (meth)acrylic acid ester polymer is a polymer obtained by polymerizing (meth)acrylic acid ester monomers. Additionally, (meth)acrylic acid ester polymers may include vinyl compound monomers other than (meth)acrylic acid ester monomers.

Examples of (meth)acrylic acid ester monomers include butyl (meth)acrylate, 2-butyl (meth)acrylate, t-butyl (meth)acrylate, pentyl (meth)acrylate, octyl (meth)acrylate, 2-ethylhexyl (meth)acrylate, nonyl (meth)acrylate, decyl (meth)acrylate, lauryl (meth)acrylate, methyl (meth)acrylate, ethyl (meth)acrylate, isopropyl (meth)acrylate, tridecyl (meth) acrylate, myristyl (meth)acrylate, cetyl (meth)acrylate, stearyl (meth)acrylate, cyclohexyl (meth)acrylate, isobornyl (meth)acrylate, dicyclopentanyl (meth)acrylate, benzyl (meth)acrylate, methoxyethyl (meth)acryalte, ethoxyethyl (meth)acrylate, butoxymethyl (meth)acrylate, butoxymethyl (meth)acrylate and ethoxy-n-propyl (meth)acrylate.

Among these, it is especially preferable for the UV-curable adhesive 120 to contain butyl (meth)acrylate and ethyl (meth)acrylate. This is because they provide sufficient initial adhesive strength to the UV-curable adhesive 120 and enable the adhesive sheet to be reliably fixed to the ring frame.

Suitable examples of the vinyl compound monomer which may be used include those having at least one functional group chosen from the group consisting of hydroxyl groups, carboxyl groups, epoxy groups, amido groups, amino groups, methylol groups, sulfonic acid groups, sulfaminic acid groups and phosphoric (phosphorous) acid groups.

Examples of vinyl compound monomers having a hydroxyl group include 2-hydroxyethyl (meth)acrylate, 2-hydroxypropyl (meth)acrylate, 2-hydroxybutyl (meth) acrylate and vinyl alcohol.

Examples of vinyl compound monomers having carboxyl groups include (meth)acrylic acid, crotonic acid, maleic acid, maleic anhydride, itaconic acid, fumaric acid, acrylamido N-glycolic acid and cinnamic acid.

Examples of vinyl compound monomers having an epoxy group include acrylgycidyl ether and (meth)acrylic acid glycidyl ether.

An example of a vinyl compound monomer having an amido group is (meth)acrylamides.

An example of a vinyl compound monomer having an amino group is N,N-dimethylaminoethyl (meth)acrylate.

An example of a vinyl compound monomer having a methylol group is N-methylol acrylamide.

Examples of the method of production of the (meth)acrylic acid ester polymer include emulsion polymerization and solution polymerization. When considering the pick up ability, the (meth)acrylic acid ester polymer should preferably be acrylic rubber produced by emulsion polymerization.

Examples of the rubber-based adhesive include natural rubber, synthetic isoprene rubber, styrene butadiene rubber, styrene-butadiene block copolymers, styrene-isoprene block copolymers, butyl rubber, polyisobutylene, polybutadiene, polyvinyl ether, silicone rubber, polyvinyl isobutyl ether, chloroprene rubber, nitrile rubber, craft rubber, reclaimed rubber, styrene-ethylene-butylene block copolymers, styrene-propylene-butylene block copolymers, styrene-isoprene block copolymers, polyisobutylene-ethylene-propylene copolymers, ethylene vinyl acetate copolymers, polyisobutylene silicone rubber and polyvinylisobutyl ether chloroprene. These may be used singly or in mixture.

The base polymer is particularly a copolymer of 35-75 mass % ethyl acrylate, 10-30 mass % butyl acrylate and 15-35 mass % methoxyethyl acrylate, and should preferably be a (meth)acrylic acid ester copolymer obtained by emulsion polymerization. This is to obtain sufficient initial adhesive strength in the adhesive sheet and to achieve reliable fixation of the adhesive sheet to the ring frame.

A UV-polymerizable compound is a low molecular weight compound having at least two photopolymerizable carbon-carbon double bonds in the molecule, which can form a three-dimensional mesh upon irradiation by UV rays.

Examples of UV-polymerizable compounds include trimethylol propane triacrylate, tetramethylol methane tetra-acrylate, pentaerythritol triacrylate, pentaerythritol tetra-acrylate, dipentaerythritol monohydroxypenta-acrylate, dipentaerythritol hexa-acrylate, 1,4-butylene glycol diacrylate, 1,6-hexanediol diacrylate, polyethylene glycol diacrylate, cyanuric acid triethylacrylate and commercially available oligoester acrylates.

Among these, dipentaerythritol hexa-acrylate is particularly preferable. This is to ensure that the UV-curable adhesive 120 is sufficiently cured after UV irradiation, so that the adhesive sheet and die attach film 130 can be easily separated, and the chips can be easily picked up.

Furthermore, aside from the above-mentioned acrylate compounds, urethane acrylate oligomers can also be used.

A urethane acrylate oligomer can be obtained by reacting a polyol compound such as a polyester or a polyether with a polyhydric isocyanate compound such as 2,4-trilene diisocyanate, 2,6-trilene diisocyanate, 1,3-xylene diisocyanate, 1,4-xylene diisocyanate, diphenylmethane 4,4-diisocyanate, trimethylhexamethylene diisocyanate, hexamethylene diisocyanate and isophorone diisocyanate to obtain an isocyanate-endcapped urethane prepolymer, and further reacting with a (meth)acrylate having a hydroxy group such as 2-hydroxyethyl (meth)acrylate, 2-hydroxypropyl (meth)acrylate, polyethylene glycol (meth)acrylate, pentaerythritol triacrylate, glycidol di(meth)acrylate and dipentaerythritol monohydroxy penta-acrylate.

As the UV-polymerizable compound, urethane acrylate oligomers having at least four vinyl groups are preferred to enable the UV-curable adhesive 120 to be sufficiently cured after UV irradiation, so that the adhesive sheet and die attach film 130 can be easily separated, and the chips easily picked up.

The UV parts by mass and at most 200 parts by mass.

As long as the content of the UV-polymerizable compound is at least 10 parts by mass, the UV-curable adhesive 120 will be sufficiently cured after UV irradiation, enabling the adhesive sheet and the die attach film 130 to be easily separated, and easily picked up.

Additionally, as long as the content of the UV-polymerizable compound is at most 200 parts by mass, the curing of the UV-curable adhesive 120 after UV irradiation will not progress too far, so that chips will not be generated during dicing, reaction residues will not leave minor traces of adhesive, and bonding failures will not occur when warming the die chip to which a die attach film 130 has been laminated while mounted on a lead frame.

Specific examples of the above-mentioned UV polymerization initiator include acetophenone type UV polymerization initiators such as 4-phenoxydichloroacetophenone, 4-t-butyldichloroacetophenone, diethoxyacetophenone, 2-hydroxy-2-methyl-1-phenylpropane-1-one, 1-(4-isopropylphenyl)-2-hydroxy-2-methylpropane-1-one, 1-(4-dodecylphenyl)-2-hydroxy-2-methylpropane-1-one, 4-(2-hydroxyethoxy)phenyl(2-hydroxy-2-propyl)ketone, 1-hydroxycyclohexylphenylketone, 2-methyl-1-[4-(methylthio)phenyl]-2-morpholinopropane-1, benzoin type UV polymerization initiators such as benzoin, benzoin methyl ether, benzoin ethyl ether, benzoin isopropyl ether, benzoin isobutyl ether and 2,2-dimethoxy-2-phenylacetophenone, benzophenone type UV polymerization initiators such as benzophenone, benzoyl benzoic acid, methyl benzoyl benzoic acid, 4-phenylbenzophenone, hydroxybenzophenone, 4-benzoyl-4'-methyldiphenylsulfide and 3,3'-dimethyl-4-methoxybenzophenone, thioxanthone type UV polymerization initiators such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone and 2,4-diisopropylthioxanthone, and special UV polymerization initiators such as α-acyloxime ester, acylphosphine oxide, methylphenylglioxylate, benzyl, camphor quinone, dibenzosuberone, 2-ethylanthraquinone and 4',4"-diethylisophthalophenone.

While the content of the above UV polymerization initiator is not particularly restricted, it should preferably be 0.1 to 15 parts by mass with respect to 100 parts by mass of the UV polymerizable compound.

As long as the content of the UV polymerization initiator is at least 0.1 parts by weight, curing action is achieved by UV irradiation, providing an adequate reduction in adhesive strength of the adhesive sheet. Additionally, as long as the content of the UV polymerization initiator is 15 parts by mass or less, sufficient stability can be obtained for the adhesive sheet even in heat or in fluorescent light.

The UV-curable adhesive 120 may include a silicone graft polymer as needed in order to improve the pick up ability. By using a silicone graft polymer, it is possible to lower the contact between the die attach film 130 and the UV-curable adhesive 120.

The silicone graft polymer is not particularly restricted as long as it is obtained by polymerizing monomers having a vinyl group at the end of the silicone molecule chain (hereinafter referred to as "silicone macromonomers"), such as homopolymers of silicone macromonomers, and copolymers of silicone macromonomers and other vinyl compounds. The silicone macromonomers are preferably compounds in which the ends of the silicone molecule chains are vinyl groups such as (meth)acryloyl groups or styryl groups.

As silicone graft polymers, it is preferable to use silicone graft polymers obtained by polymerizing 5-95 parts by mass of a silicone macromonomer having a (meth)acryloyl group and 5-96 parts by mass of methyl methacrylate, polymerized by using initiators having hydroxyl groups, so as to have at least one hydroxyl group on an end and/or a side chain of a silicone graft polymer. This is to enable the adhesive sheet and the die attach film 130 to be easily peeled apart and provide the die chip with good pick up ability.

The above-mentioned vinyl compound is preferably a (meth)acrylic monomer having good compatibility with other polymers contained in the adhesive. This is because the entire adhesive can be made homogeneous by using those with high compatibility.

While the content of the silicone graft polymer is not particularly restricted, the content of the silicone graft polymer should preferably be at least 0.1 parts by mass and at most 10 parts by mass with respect to 100 parts by mass of the base polymer.

As long as the content of the silicone graft polymer is at least 0.1 parts by mass, the adhesive sheet and die attach film 130 can be easily separated, so that the die chips can be easily picked up. Additionally, as long as the content of the silicone graft polymers is at most 10 parts by mass, the initial adhesive strength of the adhesive sheets is sufficient and it can be reliably fixed to the ring frame.

The UV-curable adhesive 120 may include a curing agent as needed in order to set the initial adhesive strength of the adhesive sheet. By using such a curing agent, it is possible to improve the cohesive force of the adhesive, so that contamination will not occur during assembly even before UV irradiation (in the un-irradiated state), thus enabling it to be re-separated.

The curing agent may be of the isocyanate type, the epoxy type or the aziridine type, which can be used singly or as a mixture. Examples of the above isocyanates include polyhydric isocyanate compounds such as 2,4-trilene diisocyanate, 2,6-trilene diisocyanate, 1,3-xylene diisocyanate, 1,4-xylene diisocyanate, diphenylmethane-4,4'-diisocyanate, diphenylmethane-2,4'-diisocyanate, 3-methyldiphenylmehane diisocyanate, hexamethylene diisocyanate, isophorone diisocyanate, dicycloxylmethane-4,4'-diisocyanate, disyclohexylmethane-2,4'-diisocyanate, lysine isocyanate, phenylene diisocyanate, trilene diisocyanate, diphenylmethadiisocyanate, cyclohexane diisocyanate, their trimethylol propane adducts, bullets reacted with water and trimers having isocyanurate rings.

Among these, trimethylol propane adducts of hexamethylene diisocyanate are preferred. This is because they provide sufficient initial adhesive strength in the adhesive sheet and enable the adhesive sheet to be reliably fixed to a ring frame.

UV-curable adhesives 120 are usually formed to a thickness of 5 to 70 μm. As long as the UV-curable adhesive 120 has a thickness in this range, it can be quickly cured by irradiation with UV rays and provides a high adhesive strength.

Additionally, the adhesive may include conventionally known adhesion-providing resins, fillers, anti-ageing agents, softeners, stabilizers or colorants which are appropriately selected and added.

(Die Attach Film)

The die attach film 130 is an adhesive sheet on which adhesives and bonding agents have been laid in the form of films. Die attach films 130 are commercially available in a state of lamination of bonding agents and adhesives onto peel-away films consisting of PET resins and the like.

The material of the die attach film 130 may be any bonding agent or adhesive resin component that is commonly used. Examples include epoxies, polyamides, acrylics, polyimides, vinyl acetates, ethylene/vinyl acetate copolymers, ethylene/acrylic acid ester copolymers, polyethylenes, polysulfones, polyamide acids, silicones, phenols, rubber polymers, fluoride rubber polymers and fluoride resins.

Among these resins, a mixture of an acrylic and an epoxy is particularly preferred. This is because they provide good bonding properties in the adhesive sheet when the die chip to which the die attach film 130 has been attached is mounted on a lead frame.

As the die attach film 130, it is possible to use a mixture, copolymer or a laminate of these components. The die attach film 130 may have mixed therein an additive such as a curing agent, a UV polymerization initiator, a charge preventing agent or a curing promoter as needed.

<Second Laminating Step>

The dicing method according to the present embodiment includes a second laminating step subsequent to the above-mentioned first laminating step, for laminating a semiconductor wafer 140 to the side of the die attach film 130 opposite to that on which the adhesive sheet is attached.

In the second laminating step, a tape mounter is used to heat the semiconductor wafer 140, then apply a die attach film surface. In order to achieve good adhesion between the semiconductor wafer 140 and the die attach film 130, the temperature during the heating should preferably be at least 40° C. and less than 90° C.

<UV Irradiation Step>

With the dicing method of the present embodiment, the second laminating step is followed by a UV irradiation step for irradiating the UV-curable adhesive 120 with UV rays.

The light source of the UV rays in the UV irradiation step is not particularly limited, and those that are publicly known may be used. Examples of light sources for UV rays include black lights, low-pressure mercury lamps, high-pressure mercury lamps, super-high-pressure mercury lamps, metal halide lamps and excimer lamps.

The quantity of UV radiation is not particularly limited, and can be chosen as appropriate to the design of the UV-curable adhesive 120, but should preferably be at least 5 $mJ/cm^2$ and at most 1000 $mJ/cm^2$.

As long as the quantity of UV radiation is at least 5 $mJ/cm^2$, the UV-curable adhesive 120 can be sufficiently cured so as to have good pick up ability. Additionally, as long as the quantity of UV radiation is 1000 $mJ/cm^2$ or less, the curing can be achieved by UV irradiation in a short period of time.

<Dicing Step>

In the dicing method of the present embodiment, the UV irradiation step is followed by a dicing step of dicing the die attach film 130 laminated to the adhesive sheet and the semiconductor wafer 140.

In the dicing step, dicing equipment is used to cut the semiconductor wafer 140 by high-speed rotation of a dicing plate containing diamond abrasive grains.

By providing a UV irradiation step for irradiating the UV-curable adhesive 120 with UV rays between the second laminating step and the dicing step in the dicing method of the present invention as described above, the adhesive strength of the UV-curable adhesive 120 can be lowered beforehand while raising the cohesive force. As a result, when picking up the chips with die attach films 130 after dicing, the intermixture of the die attach film 130 and the UV-curable adhesive layer 120 of the adhesive sheet on the dicing line can be reduced, thereby suppressing pick up failures.

Of course, as with conventional methods, another UV irradiation step or radiation exposure step may be provided after the dicing step.

Additionally, a pick up step of picking up the separately cut chips from the adhesive sheet may be provided after the dicing step or after the second UV irradiation step.

Additionally, the UV-curable adhesive 120 may comprise a (meth)acrylic acid ester polymer, a urethane acrylate oligomer having at least 4 vinyl groups, a UV polymerization initiator and a silicone graft polymer. As a result, the ability to pick up the chips can be improved.

Additionally, the die attach film 130 may comprise at least an epoxy resin, a polyimide resin, or an acrylic resin, and the thickness of the die attach film 130 may be at least 10 μm. As a result, when mounting the die chip to which the die attach film 130 has been attached onto the lead frame, good adhesive properties can be obtained for the adhesive sheet.

Embodiments of the present invention have been described above, but these are merely examples of the present invention, and various other structures can be employed.

EXAMPLES

Herebelow, the present invention shall be further explained by means of examples, but the present invention is not limited thereto.

<Preparation of Experimental Materials>

The following materials were obtained to form an adhesive sheet.

Base Polymer: A (meth)acrylic acid ester polymer (produced by applicant) which is a copolymer of 54 mass % ethyl acrylate, 22 mass % butyl acrylate and 24 mass % methoxyethyl acrylate, formed by emulsion polymerization.

UV-polymerizable Compound A: An acrylate-endcapped oligomer obtained by reacting a hexamethylene diisocyanate (aliphatic diisocyanate) trimer with the terminus of a poly (propylene oxide)diol to obtain an isocyanate-endcapped oligomer, and further reacting with pentaerythritol penta-acrylate. A urethane acrylate oligomer (produced by applicant) having a number-average molecular weight (Mn) of 3,700 and 15 acrylate functional groups (15 functions).

UV-polymerizable Compound B: Pentaerythritol tri-acrylate (Shin-Nakamura Chemical NK Ester A-TMM-3L).

UV Polymerization Initiator: Benzyldimethyl ketal (Ciba Japan Irgacure 651).

Silicone Graft Polymer: A hydroxyl group-containing silicone graft polymer (produced by applicant) obtained by polymerizing 30 parts by mass of a silicone macromonomer and 70 parts by mass of methyl methacrylate using an initiator having two hydroxyl groups. The silicone macromonomer was a silicone macromonomer (produced by applicant) having a methacryloyl group at the terminus of the silicone molecule chain.

Curing Agent: 1,6-hexamethylene diisocyanate and trimethylol propane adduct (Nippon Polyurethane Industry Coronate HL).

The experimental materials of the Example were produced in accordance with the methods indicated below. The proportional content of the above-described substances is listed in Table 1.

TABLE 1

| | Experiment No. | 1 | 2 | 3 | 4 | 5 | 6 | 7 | 8 | 9 | 10 |
|---|---|---|---|---|---|---|---|---|---|---|---|
| UV-curable adhesive layer | Base polymer | 100 | 100 | 100 | 100 | 100 | 100 | 100 | 100 | 100 | 100 |
| | UV-polymerizable compound | A 100 | A 100 | A 100 | A 100 | A 100 | A 100 | A 10 | A 200 | A 5 | A 300 |
| | UV polymerization initiator | 5 | 5 | 5 | 5 | 5 | 15 | 1 | 10 | 0.5 | 15 |
| | Silicone graft polymer | 2 | 2 | 2 | 0.1 | 10 | 2 | 2 | 2 | 2 | 2 |
| UV irradiation step | Energy (mJ/cm$^2$) | 150 | 5 | 1000 | 150 | 150 | 150 | 150 | 150 | 150 | 150 |
| Evaluation | Chip retention | A | A | A | A | A | A | A | A | B | B |
| | Pick up ability | A | A | A | A | A | A | A | A | B | A |
| | Overall | A | A | A | A | A | A | A | A | B | B |
| Comments | | Ex. | Ex. | Ex. | Ex. | Ex. | Ex. | Ex. | Ex. | Ex. | Ex. |

| | Experiment No. | 11 | 12 | 13 | 14 | 15 | 16 | 17 | 18 | 19 |
|---|---|---|---|---|---|---|---|---|---|---|
| UV-curable adhesive layer | Base polymer | 100 | 100 | 100 | 100 | 100 | 100 | 100 | 100 | 100 |
| | UV-polymerizable compound | A 100 | A 100 | A 100 | B 100 | A 100 | A 100 | A 100 | A 100 | A 100 |
| | UV polymerization initiator | 0.1 | 0.05 | 20 | 5 | 5 | 5 | 5 | 5 | 5 |
| | Silicone graft polymer | 2 | 2 | 2 | 0 | 0.01 | 15 | 2 | 2 | 2 |
| UV irradiation step | Energy (mJ/cm$^2$) | 150 | 150 | 150 | 150 | 150 | 150 | 1 | 1500 | 0 |
| Evaluation | Chip retention | A | A | A | A | A | B | A | B | A |
| | Pick up ability | A | B | B | B | B | A | B | A | C |
| | Overall | A | B | B | A | B | B | B | B | C |
| Comments | | Ex. | Ex. | Ex. | Ex. | Ex. | Ex. | Ex. | Ex. | Comp. Ex. |

The main constituents and their amounts in the adhesives corresponding to the respective experiment numbers are shown in Table 1. In preparing the adhesives, 3 parts by mass of a curing agent were added in addition to the constituents shown in the table.

Next, the adhesives were applied to PET separator films so as to result in the thickness of the adhesive layer after drying being 10 μm, and laminated onto a substrate film 110 to form an adhesive sheet.

As the substrate film 110, a film (DuPont Mitsui Polychemicals Himilan 1650) composed of ionomer resins mainly constituted from Zn salts of ethylene-methacrylic acid-methacrylic acid alkyl ester copolymers, having a melt flow rate (MFR) of 1.5 g/10 minutes (JIS K7210, 210° C.) and a melting point of 96° C., and containing $Zn^{2+}$ ions, was used.

The following was obtained as a die attach film 130.
Die Attach Film: A film of thickness 30 μm, its composition being a mixture of an acrylic resin and an epoxy resin.

The evaluation was performed using a semiconductor wafer 140 of diameter 6 inches and thickness 0.1 mm.

<Laminating Step>

A die attach film 130 was laminated to the adhesive sheet, and a semiconductor wafer 140 was laminated to the die attach film 130 on the side opposite that laminated to the adhesive sheet <UV Irradiation Step>

The sample in the above laminating step was irradiated with UV rays from the adhesive sheet side using a high-pressure mercury lamp. The adhesive strength of the adhesive layer was reduced by this UV irradiation.

<Dicing Step>

The laminated wafer 140 was cut and separated to form chips. The adhesive sheet was cut to a depth of 30 μm. The dicing was performed to a chip size of 10 mm 10 mm.

The dicing machine was a Disco DAD341. The dicing blade was a Disco NBC-ZH205O-27HEEE.

Dicing blade shape: outside diameter 55.56 mm, blade width 35 μm, inside diameter 19.05 mm
Dicing blade rotation rate: 40,000 rpm
Dicing blade advance speed: 80 mm/second
Cutting water temperature: 25° C.
Cutting water quantity: 1.0 L/minute <Pick Up Step>

The separately cut chips were picked up from the adhesive sheet.

The pick up equipment was a Canon Machinery CAP-300II.
Number of needle pins: 5
Height of needle pins: 0.3 mm
Expansion amount: 5 mm <Evaluation of Experimental Results>

Chip Retention: The number of chips with die attachment films retained on the adhesive sheet when dicing a semiconductor under the above-described conditions was evaluated.

A (excellent): At least 95% of chips retained on adhesive sheet.
B (good): At least 90% and less than 95% of chips retained on adhesive sheet.
C (poor): Less than 90% of chips retained on adhesive sheet.

Pick up ability: The number of chips capable of being picked up with the dieattach film 130 attached after dicing a semiconductor wafer 140 under the above-described conditions was evaluated.

A (excellent): At least 95% of chips picked up.
B (good): At least 80% and less than 95% of chips picked up.
C (poor): Less than 90% of chips picked up.

As is clear from the results in the above table, according to the dicing method of the present invention, the adhesive strength of a UV-curable adhesive 120 can be reduced beforehand while increasing the cohesive force. As a result, pick up failures when picking up chips with die attach films 130 after dicing can be suppressed.

The invention claimed is:

1. A dicing method for a semiconductor wafer having a die attach film, comprising:
    a first laminating step of laminating the die attach film to an adhesive sheet formed by laminating a UV-curable adhesive comprising a (meth)acrylic acid ester polymer, a urethane acrylate oligomer having at least 4 vinyl groups, a UV polymerization initiator and a silicone graft polymer onto a substrate film;
    a second laminating step of laminating the semiconductor wafer onto an opposite side of the die attach film laminated to the adhesive sheet;
    a UV irradiation step of irradiating the UV-curable adhesive with UV rays; and
    a dicing step of dicing the semiconductor wafer and die attach film laminated to the adhesive sheet,
    wherein the content of the silicone graft polymer is at least 0.1 parts by mass and at most 10 parts by mass with respect to 100 parts by mass of the (meth)acrylic acid ester polymer.

2. The dicing method according to claim 1, wherein the die attach film comprises at least an epoxy resin, a polyimide resin and an acrylic resin, and a thickness of the die attach film is at least 10 μm.

* * * * *